(12) United States Patent
Woo

(10) Patent No.: US 10,358,736 B2
(45) Date of Patent: *Jul. 23, 2019

(54) PURGE GAS SPRAYING PLATE FOR FUME REMOVING OF A SEMICONDUCTOR MANUFACTURING APPARATUS

(71) Applicant: Bum Je Woo, Seongnam-si (KR)

(72) Inventor: Bum Je Woo, Seongnam-si (KR)

( * ) Notice: Subject to any disclaimer, the term of this patent is extended or adjusted under 35 U.S.C. 154(b) by 209 days.

This patent is subject to a terminal disclaimer.

(21) Appl. No.: 14/725,245

(22) Filed: May 29, 2015

(65) Prior Publication Data
US 2016/0263591 A1 Sep. 15, 2016

(30) Foreign Application Priority Data

Mar. 10, 2015 (KR) .................. 10-2015-0032921

(51) Int. Cl.
*C25D 11/04* (2006.01)
*H01L 21/673* (2006.01)

(52) U.S. Cl.
CPC ........ *C25D 11/04* (2013.01); *H01L 21/67393* (2013.01)

(58) Field of Classification Search
CPC ..... B05B 1/005; B05B 1/14; H01L 21/67393; H01L 21/67017; H01L 21/6732; H01L 21/673; C25D 11/04
USPC ...... 239/601, 553.5, 296, 406, 553.3, 590.3, 239/299; 118/728
See application file for complete search history.

(56) References Cited

U.S. PATENT DOCUMENTS

| | | | | |
|---|---|---|---|---|
| 469,211 A | * | 2/1892 | Kline | B05B 1/14 |
| | | | | 239/553.5 |
| 2,031,387 A | * | 2/1936 | Schwarz | D01D 5/28 |
| | | | | 425/131.5 |
| 2,297,726 A | * | 10/1942 | Stephanoff | B01D 1/18 |
| | | | | 116/137 A |
| 3,176,345 A | * | 4/1965 | Powell | D01D 5/32 |
| | | | | 425/131.5 |
| 3,192,562 A | * | 7/1965 | Powell | D01D 5/30 |
| | | | | 250/396 R |
| 3,204,290 A | * | 9/1965 | Crompton | D01D 5/30 |
| | | | | 425/190 |

(Continued)

FOREIGN PATENT DOCUMENTS

JP 05068925 3/1993
JP 06275588 9/1994
(Continued)

OTHER PUBLICATIONS

Korean Office Action—Korean Application No. 10-2015-0032921 dated Mar. 3, 2016, citing KR 10-1444241, JP 05-068925, KR 10-2014-0088406, KR 10-2003-0077803 and JP 06-275588.

*Primary Examiner* — Viet Le
*Assistant Examiner* — Steven M Cernoch

(57) ABSTRACT

Provided are a purge gas spraying plate and a method of manufacturing the same, and more particularly, a purge gas spraying plate which sprays a purge gas and a method of manufacturing the same. The purge gas spraying plate is formed by coupling a first plate and a second plate, and a flow path is formed in at least any one of the first plate and the second plate. Thus, compactness of a fume removing apparatus having the purge gas spraying plate is achieved.

17 Claims, 12 Drawing Sheets

(56) References Cited

U.S. PATENT DOCUMENTS

| | | | | |
|---|---|---|---|---|
| 3,334,792 A * | 8/1967 | Piencinski | B05C 5/0254 | 118/207 |
| 3,492,692 A * | 2/1970 | Soda | B29C 47/003 | 264/DIG. 26 |
| 3,501,805 A * | 3/1970 | Douglas, Jr. | D01D 5/28 | 425/131.5 |
| 3,613,170 A * | 10/1971 | Soda | D01D 5/34 | 264/172.15 |
| 3,650,866 A * | 3/1972 | Prentice | B29C 43/006 | 156/161 |
| 3,704,198 A * | 11/1972 | Prentice | D04H 3/16 | 264/210.1 |
| 3,730,662 A * | 5/1973 | Nunning | D01D 4/06 | 264/172.14 |
| 3,803,951 A * | 4/1974 | Bagley | B28B 3/269 | 228/141.1 |
| 3,807,917 A * | 4/1974 | Shimoda | D01D 5/34 | 264/172.15 |
| 3,852,013 A * | 12/1974 | Upmeier | B29C 47/70 | 137/884 |
| 4,052,002 A * | 10/1977 | Stouffer | A61C 17/0214 | 137/835 |
| 4,151,955 A * | 5/1979 | Stouffer | B05B 1/08 | 137/835 |
| 4,596,364 A * | 6/1986 | Bauer | A46B 11/00 | 137/842 |
| 4,730,197 A * | 3/1988 | Raman | B41J 2/14233 | 347/10 |
| 4,875,844 A * | 10/1989 | Nakajima | D01D 5/34 | 264/172.15 |
| 4,905,909 A * | 3/1990 | Woods | B05B 1/08 | 137/820 |
| 4,955,547 A * | 9/1990 | Woods | B05B 1/08 | 137/820 |
| RE33,448 E * | 11/1990 | Bauer | B05B 1/08 | 137/816 |
| 5,209,410 A * | 5/1993 | Wichmann | B05B 5/0255 | 239/562 |
| 5,551,588 A * | 9/1996 | Hills | D01D 5/30 | 216/41 |
| 5,588,597 A * | 12/1996 | Reinecke | B41J 2/1404 | 239/553.5 |
| 5,618,566 A * | 4/1997 | Allen | B05C 5/0279 | 264/12 |
| 5,620,139 A * | 4/1997 | Ziecker | B05B 7/1209 | 239/124 |
| 5,679,379 A * | 10/1997 | Fabbricante | B29C 33/302 | 425/192 S |
| 5,902,540 A * | 5/1999 | Kwok | B05C 5/0279 | 264/103 |
| 5,904,298 A * | 5/1999 | Kwok | B05C 5/0275 | 239/11 |
| 6,015,102 A * | 1/2000 | Daigle | A01G 25/023 | 239/533.13 |
| 6,051,180 A * | 4/2000 | Kwok | D01D 5/0985 | 264/103 |
| 6,053,982 A * | 4/2000 | Halpin | C23C 16/455 | 118/500 |
| 6,148,761 A * | 11/2000 | Majewski | C23C 16/45565 | 118/715 |
| 6,176,023 B1 * | 1/2001 | Doche | H01L 21/67353 | 34/107 |
| 6,200,387 B1 * | 3/2001 | Ni | H01L 21/67075 | 118/715 |
| 6,367,782 B1 * | 4/2002 | Guetersloh | F28D 5/02 | 239/553.5 |
| 6,375,099 B1 * | 4/2002 | McGuffey | B05C 5/0254 | 239/124 |
| 7,041,171 B2 * | 5/2006 | DeMent | B05C 5/027 | 118/300 |
| 7,270,711 B2 * | 9/2007 | DeMent | B29C 41/04 | 118/300 |
| 8,047,457 B2 * | 11/2011 | Hahn | B05B 1/044 | 239/428.5 |
| 9,353,439 B2 * | 5/2016 | Kashyap | C23C 16/45525 | |
| 9,437,466 B2 * | 9/2016 | Sakiya | H01L 21/67265 | |
| 9,842,746 B2 * | 12/2017 | Woo | H01L 21/6732 | |
| 2005/0156063 A1 * | 7/2005 | Tsuji | C23C 16/401 | 239/548 |
| 2011/0005967 A1 * | 1/2011 | Gregerson | H01L 21/67383 | 206/711 |
| 2011/0062052 A1 * | 3/2011 | Ku | H01L 21/67383 | 206/711 |
| 2012/0161405 A1 * | 6/2012 | Mohn | C23C 16/401 | 279/142 |
| 2013/0168462 A1 * | 7/2013 | Kerr | C23C 16/45551 | 239/1 |
| 2013/0341433 A1 * | 12/2013 | Roy | C23C 16/45565 | 239/548 |
| 2014/0179114 A1 * | 6/2014 | van Schravendijk | C23C 16/455 | 438/758 |
| 2014/0187049 A1 * | 7/2014 | Augustino | C23C 16/45565 | 438/706 |
| 2014/0235069 A1 * | 8/2014 | Breiling | F28F 3/02 | 438/778 |
| 2014/0353495 A1 * | 12/2014 | Inagaki | G01N 21/714 | 250/288 |
| 2016/0118282 A1 * | 4/2016 | Maraschin | H01L 21/67393 | 414/222.07 |

FOREIGN PATENT DOCUMENTS

| KR | 1020030077803 | 10/2003 |
|---|---|---|
| KR | 1020140088406 | 7/2014 |
| KR | 101444241 | 9/2014 |

* cited by examiner

PURGE GAS SPRAYING PLATE FOR FUME REMOVING OF A SEMICONDUCTOR MANUFACTURING APPARATUS

BACKGROUND

1. Technical Field

The present invention relates to a purge gas spraying plate and a method of manufacturing the same, and more particularly, a purge gas spraying plate which is capable of achieving the compactness of a fume removing apparatus having the purge gas spraying plate and a method of manufacturing the same.

2. Description of the Related Art

Generally, semiconductor devices are manufactured by depositing thin films for performing various functions on upper surfaces of the wafers, and patterning the thin films to form various circuit geometries.

Unit processes for manufacturing the semiconductor devices can be mainly divided into an impurity ion implantation process by which impurities such as group 3B elements or group 5B elements are implanted into an inside of the semiconductor, a thin film deposition process which forms material films on a semiconductor substrate, an etching process which forms predetermined patterns using the material films, a planarization process such as a chemical mechanical polishing (CMP) process which removes step differences by polishing a surface of a wafer in a lump after depositing interlayer insulating films and the like on an upper surface of the wafer, and a cleaning process for removing residues.

Meanwhile, wafers on which the predetermined process described above is completed are not transferred as an individual wafer, but are transferred as a batch of 20 to 25 wafers, which are seated in a cassette. At this time, the wafers on which process gases used for the process and fumes which are by-products of the process are not removed and remain on surfaces of the wafers are seated in the cassette.

However, the residues described above causes the contamination of a semiconductor manufacturing apparatus and defects of etch patterns when a subsequent process is performed in a state in which the residues are attached to the surfaces of the wafers. As a result, since the reliability of a device is decreased, many techniques have been developed to remove the residues.

As described above, a conventional purge gas spraying plate for an apparatus for removing fumes remaining on surfaces of wafers is disclosed in Korean Patent Application No. 1444241.

As illustrated in FIGS. 1 and 2, a cleaning apparatus 100 as a conventional fume removing apparatus is formed with a side cleaning apparatus 110 and a rear cleaning apparatus 130.

The side cleaning apparatus 110 includes wafer support members 111 and spacers 113.

The wafer support members 111 are each provided with a rib 111a and through holes 111b.

The rib 111a includes a step 111aa at an edge thereof to easily seat a wafer 5 inserted from one side thereof.

The plurality of through holes 111b are formed at equidistant intervals in a longitudinal direction to be easily coupled with a plurality of spacers 113, which will be described below, using bolts BT.

The spacer 113 is provided on an upper side of the wafer support member 111.

The spacer 113 formed in a bar shape having a cross-sectional rectangular shape is provided with an inlet 113a in a longitudinal direction of one side thereof so that a purge gas sprayed from a pneumatic block flows in, and a plurality of spraying holes 113b at equidistant intervals in a direction perpendicular to a side of the inlet 113a.

The inlet 113a described above is directly connected to an outlet of the pneumatic block to enable a purge gas ($N_2$ gas) to be individually sprayed through only the spraying holes 113b corresponding to a portion at which a wafer 5 is provided.

Through holes 113c are formed at locations respectively the same as the centers of the through holes 111b of the wafer support member 111 at equidistant intervals in a longitudinal direction of the spacer 113 to be easily coupled therewith using bolts.

As described above, a configuration of one set having the wafer support member 111 and the spacer 113 is vertically repeated as a plurality, and thus, it is possible to clean a plurality of stacked wafers 5.

In addition, the rear cleaning apparatus 130 is provided at one end of the side cleaning apparatus 110 in a rear direction, i.e., based on a direction illustrated in FIG. 1.

The rear cleaning apparatus 130 has a plurality of spraying holes 131, which are stacked and provided at a rear of the side cleaning apparatus 110 in a direction perpendicular thereto and formed at the same levels as the spraying holes 113b of the spacer 113, at equidistant intervals in a longitudinal direction.

However, since the spacer 113 spraying a purge gas in a conventional fume removing apparatus has a bar shape with a height, when the fume removing apparatus processes many wafers, the number of spacers 113 the same as the number of wafers to be processed are required. Thus, there is a problem in which the size of the fume removing apparatus is increased.

In addition, in order to overcome the problem described above, when the height of the spacer 113 is decreased, that is, the spacer 113 is formed in a thin plate shape rather than a bar shape, there are problems in which it is difficult to manufacture the inlet 113a and the spraying hole 113b inside the spacer 113, and it is not easy to determine defects when the defects occur in manufacturing.

In addition, since the spraying holes 113b of the spacer 113 are formed to be only disposed linearly without considering a circular shape of a wafer, there is an area having a big gap between the spraying holes 113b and the circumference of the wafer, and thus, a dead zone in which fumes remaining on the wafer cannot be removed can be generated.

SUMMARY

The present invention is directed to a purge gas spraying plate which achieves compactness of a fume removing apparatus, is easily manufactured, and removes a dead zone, and a method of manufacturing the same.

In accordance with one aspect of the present invention, a purge gas spraying plate includes a plate, an inlet formed in the plate, and a flow path which communicates with the inlet, and the plate is formed by coupling a first plate and a second plate, and the flow path is formed in at least any one of surfaces of the first plate and the second plate which are coupled.

In addition, the flow path may include a main flow path through which a purge gas introduced from the inlet flows, and a branch flow path having one end in communication with the main flow path and the other end configured to spray the purge gas to an outside thereof, and the branch flow path may be formed in plural number.

In addition, the purge gas may be sprayed in a direction of a downward slope from the other end of the branch flow path.

In addition, a cross-sectional area of the main flow path may be greater than that of each of the plurality of branch flow paths.

In addition, a cross-sectional area of a branch flow path close to the inlet among the plurality of branch flow paths may be smaller than that of a branch flow path farthest away from the inlet.

In addition, at least one obtuse angle may be formed between the main flow path and the plurality of branch flow paths based on a direction in which the purge gas flows.

In addition, a branch flow path farthest away from the inlet among the plurality of branch flow paths and the main flow path may form an obtuse angle based on a direction in which the purge gas flows.

In addition, a nozzle configured to spray the purge gas to the outside thereof may be installed at least any one of the other ends of the plurality of branch flow paths.

In addition, nozzles configured to spray the purge gas to the outside thereof may be installed at least two of the other ends of the plurality of branch flow paths, and a length of at least one nozzle of the at least two nozzles may be longer than that of the remaining nozzles.

In addition, the plate may be made of a metal, and an anodic oxide film may be formed on the flow path.

In addition, the plate may be made of aluminum, and the anodic oxide film may be an anodized layer formed by anodizing the aluminum.

In addition, the purge gas spraying plate may further include a coupling member configured to couple the first plate and the second plate; and an insulating film adhered on an upper surface of the coupling member.

In addition, a fluoro-based resin coating layer may be formed on the plate.

In addition, a support member configured to support a wafer may be formed on the plate.

In addition, a concave portion may be formed at one side facing a wafer among sides of the plate.

In addition, the concave portion may be formed in a circular arc shape.

In addition, a support member configured to support a wafer may be formed on the concave portion.

In accordance with another aspect of the present invention, a method of manufacturing a purge gas spraying plate in which a purge gas flows through a flow path formed at an inside thereof includes coupling a first plate and a second plate to form the purge gas spraying plate, wherein the flow path is formed in at least one of surfaces of the first plate and the second plate which are coupled.

In addition, an anodic oxide film may be formed on the first plate and the second plate to couple the first plate and the second plate which are formed of a metal.

In addition, the first plate and the second plate may be formed of aluminum, and the anodic oxide film may be an anodized layer formed by anodizing the aluminum.

In addition, the method further may include coupling the first plate and the second plate using a bolt, and adhering an insulating film on an upper surface of the bolt.

In addition, the method may further include coating the first plate and the second plate with a fluoro-based resin after the coupling of the first plate and the second plate.

As described above, according to the purge gas spraying plate and the method of manufacturing the same of embodiments of the present invention, the provided effects are as follows.

Since a plate is formed by coupling a first plate and a second plate, and a flow path is formed in at least any one of surfaces of the first plate and the second plate, which are coupled, and communicates with an inlet formed in the plate, even when the purge gas spraying plate is manufactured to be thin, a structure of the flow path can be manufactured easily, and defects occurring when the structure of the flow path is manufactured can be easily determined.

Thus, since a thinner purge gas spraying plate than a purge gas spraying plate of a conventional fume removing apparatus can be manufactured, even when a fume removing apparatus capable of processing many wafers is manufactured, compactness of the fume removing apparatus can be achieved because the purge gas spraying plate can be manufactured to have a low height.

Since the flow path of the purge gas spraying plate includes a main flow path in which a purge gas introduced from the inlet flows and a plurality of branch flow paths in communication with the main flow path, and the purge gas is sprayed in a direction of a downward slope from the other end of the branch flow paths, the amount of the sprayed purge gas can be increased in a wafer direction to effectively remove the fumes remaining on the wafer.

In addition, even when a wafer is not seated on a purge gas spraying plate just below each purge gas spraying plate when some of a maximum number of wafers are seated, since a purge gas sprayed from the other end of the branch flow path is sprayed in a direction of a downward slope, the purge gas can be more effectively sprayed to the seated wafer so as to more effectively remove fumes remaining on the seated wafer.

Since the flow path of the purge gas spraying plate includes a main flow path in which a purge gas introduced from the inlet flows and a plurality of branch flow paths in communication with the main flow path, and cross-sectional areas of the main flow path and the branch flow paths can be controlled, or angles formed by the main flow path and the branch flow paths can be controlled, the amount and flow rate of a sprayed purge gas can be controlled to reduce the amount of the purge gas used for removing fumes.

Since the plate is formed of a metal, and an anodic oxide film is formed on the flow path, even when a small amount of fume gas flows in the flow path, the flow path can be prevented from corroding, deforming, etc.

In addition, since the plate is formed of aluminum, and the anodic oxide film is formed as an anodized layer, a precision processing of a structure of a flow path is easily performed due to a characteristic of aluminum, and the cost of manufacturing is inexpensive, and since the anodizing layer is formed by anodizing the aluminum, the same effect as an anodic oxide film formed on a metal may be achieved.

In addition, since an insulating film is adhered on upper sides of coupling members configured to couple the first plate and the second plate, and a fluoro-based resin coating layer is formed on the plate in which the first plate and the second plate are coupled, a coupling portion generated by coupling the first plate and the second plate is coated with the fluoro-based resin coating layer to prevent a purge gas from being leaked through the coupling portion of the flow path when the purge gas flows in the flow path formed at any one of the first plate or the second plate.

Since a support member configured to support a wafer is formed on the plate, roles in which a purge gas is sprayed and the wafer is supported are performed at the same time, and since the design thereof is simplified compared to that of a conventional fume removing apparatus in which a spraying portion and a support are separately manufactured, compactness of the fume removing apparatus can be achieved.

In addition, since a concave portion is formed on one side of the plate, and a support member configured to support a wafer is formed on the concave portion, the wafer can be seated on the support member formed on the concave portion to be stably fixed.

In addition, since the concave portion is formed in a circular arc shape, when the fumes remaining on the wafer are removed, a purge gas flowing through the flow path is sprayed along the concave portion having the circular arc shape with the same curvature as that of the wafer, and since the purge gas thereof is sprayed closer to the wafer compared to that of a conventional fume removing apparatus, a dead zone in which fumes cannot be removed is not generated, and fumes remaining on the wafer can be also effectively removed using an smaller amount of the purge gas.

DETAILED DESCRIPTION OF EMBODIMENTS

Hereinafter, exemplary embodiments of the invention will be described in detail with reference to the accompanying drawings.

Figure 1:
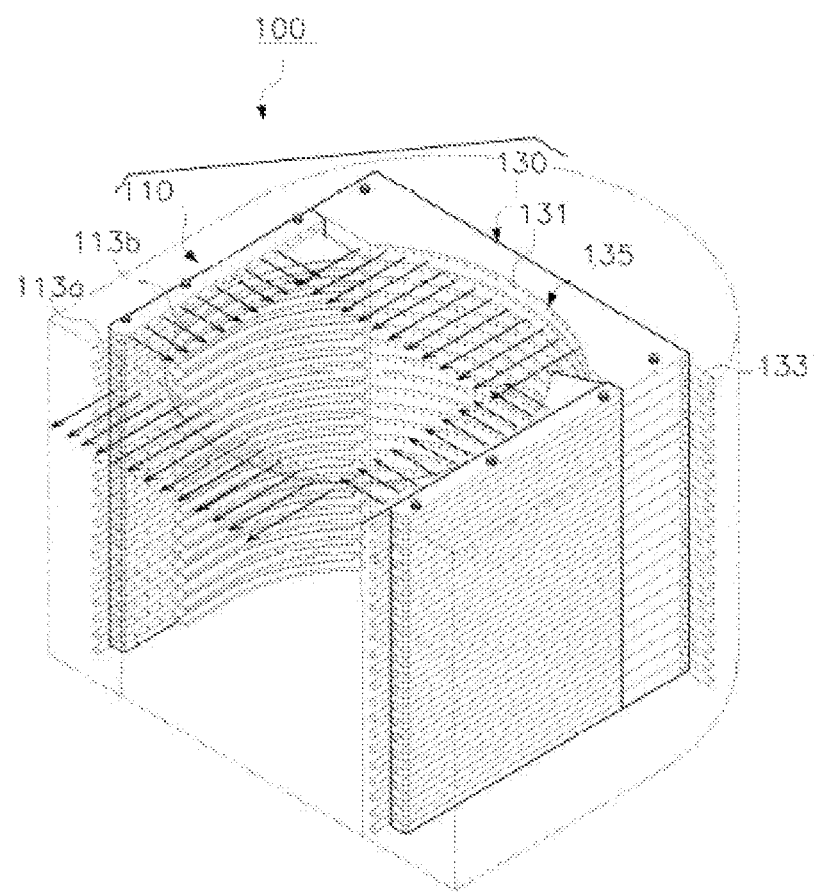
FIG. 1 is a perspective view illustrating a conventional fume removing apparatus.
Figure 2:
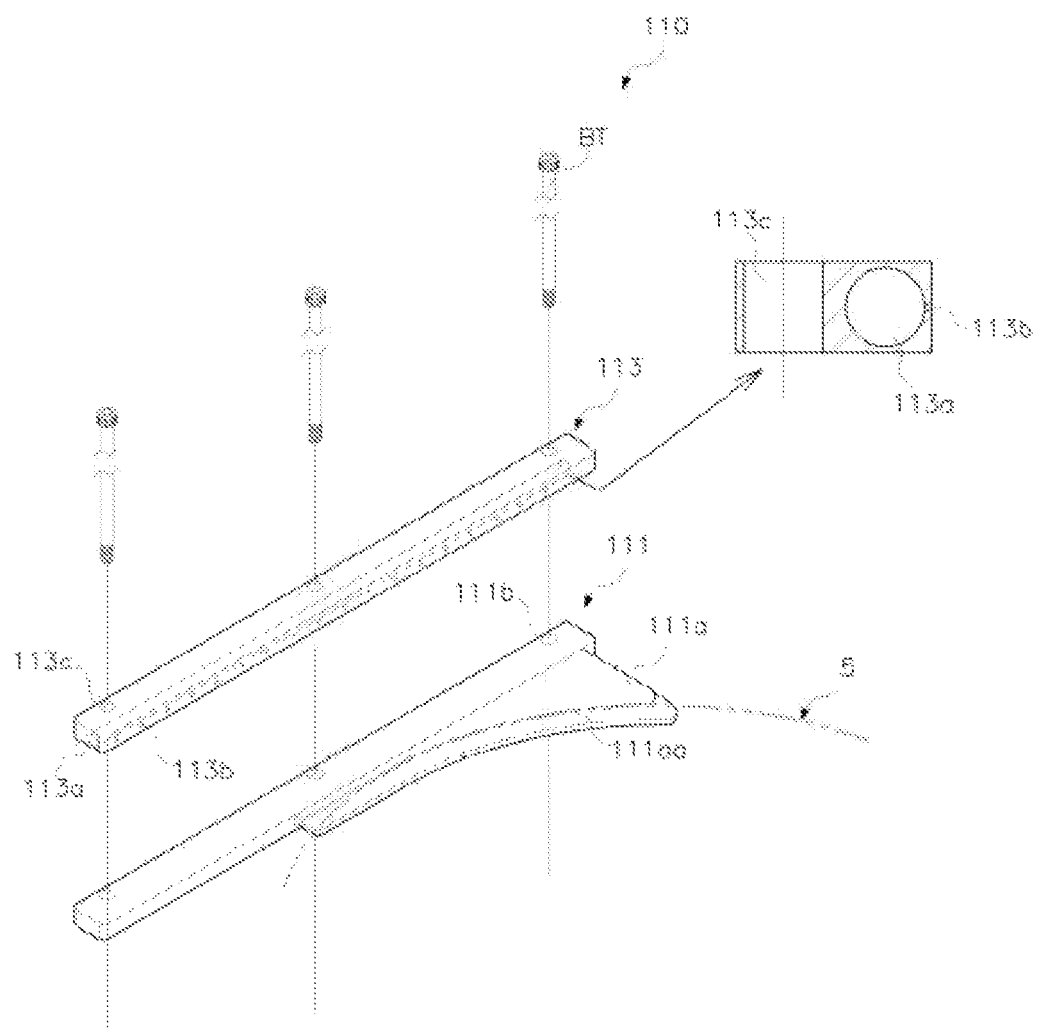
FIG. 2 is an exploded perspective view illustrating a wafer support member and a spacer in FIG. 1.
Figure 3:
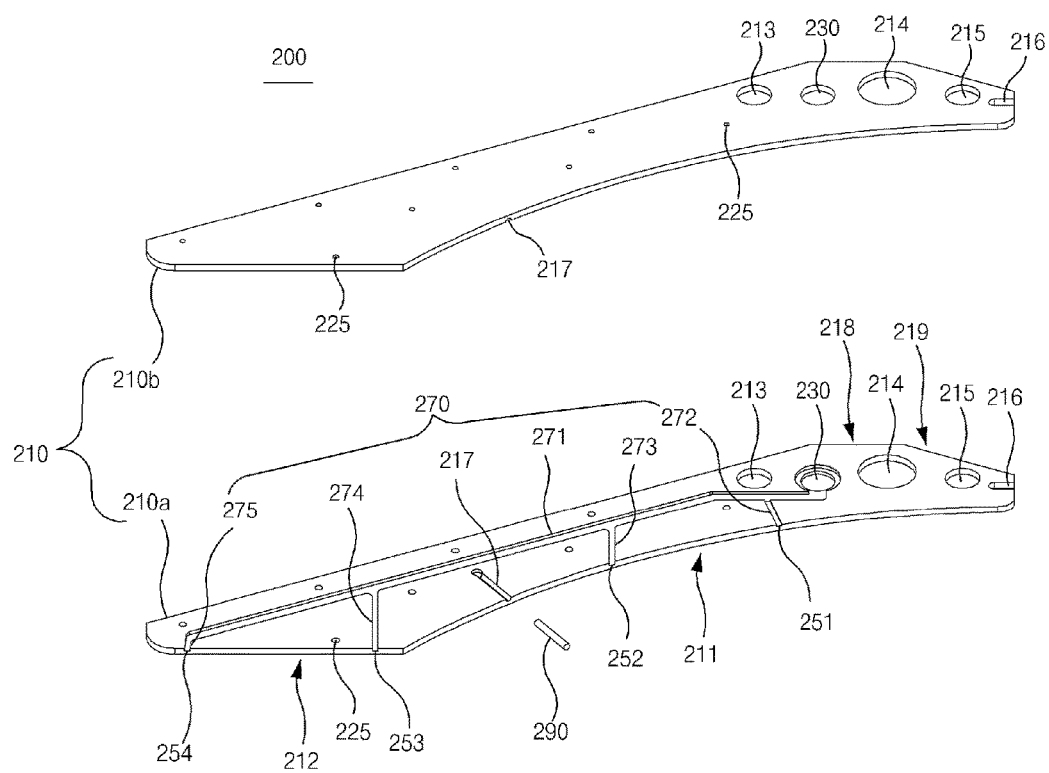
FIG. 3 is a perspective view illustrating a purge gas spraying plate according to a first embodiment of the present invention.
Figure 4:
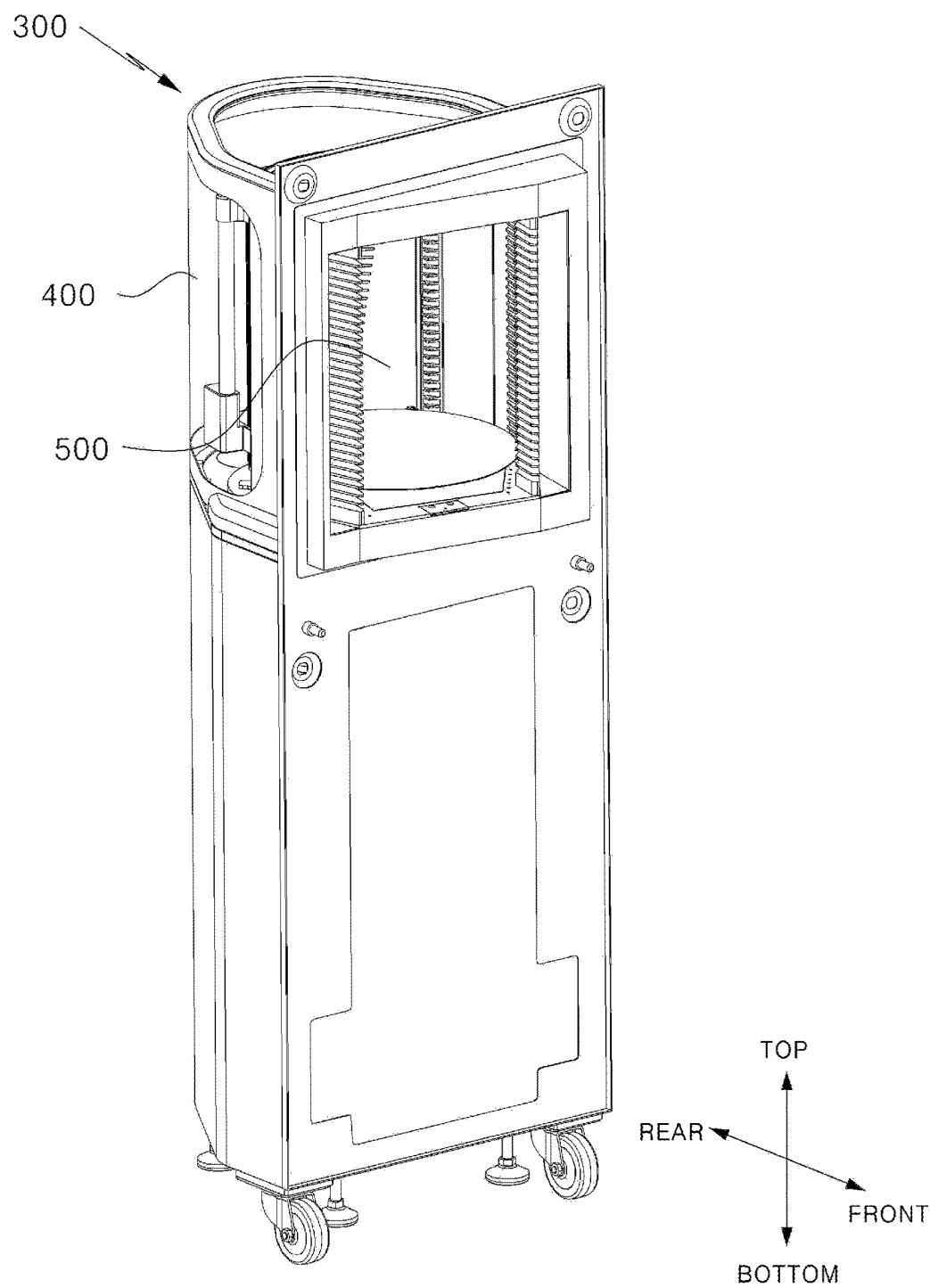
FIG. 4 is a perspective view illustrating a fume removing apparatus including the purge gas spraying plate according to the first embodiment of the present invention.
Figure 5:
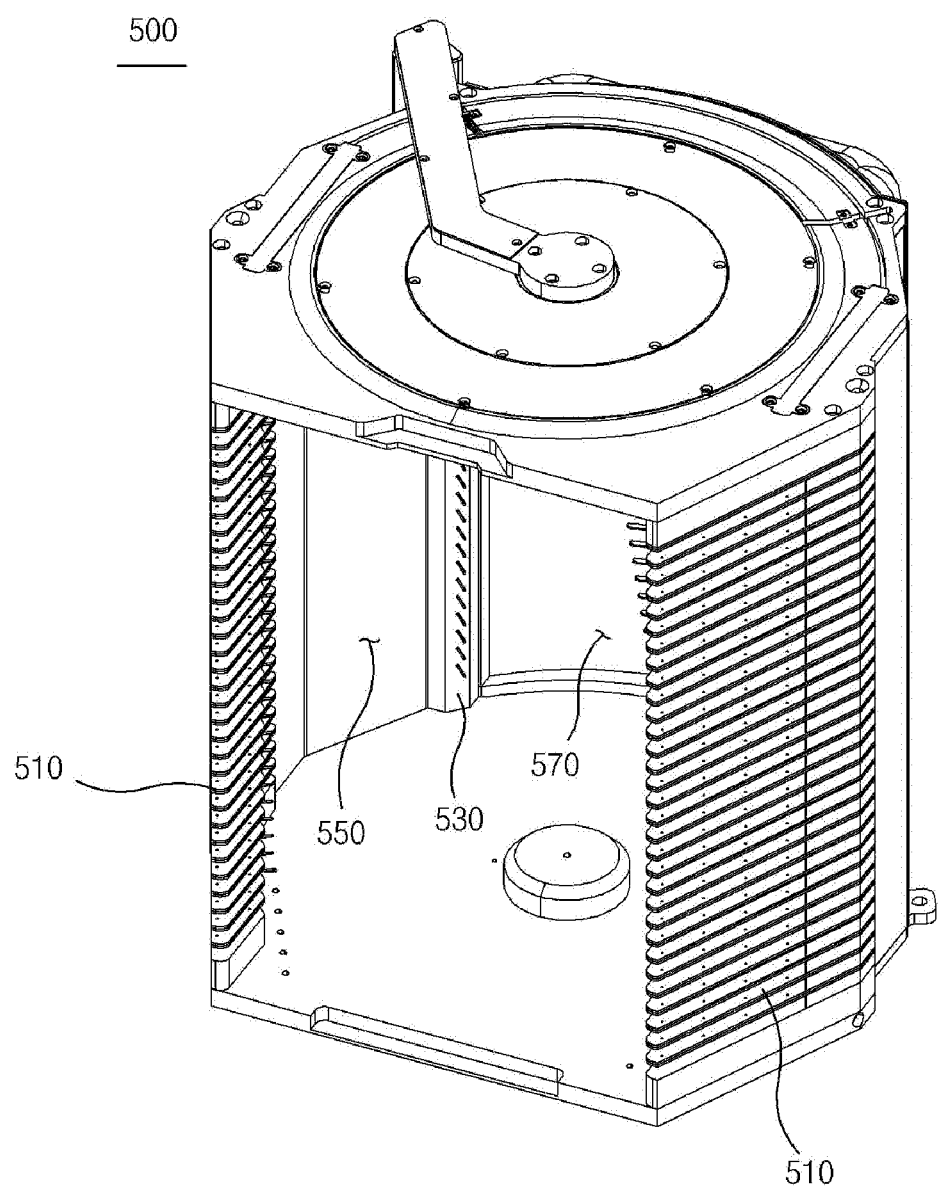
FIG. 5 is a perspective view illustrating a wafer cassette in FIG. 4.
Figure 6A:
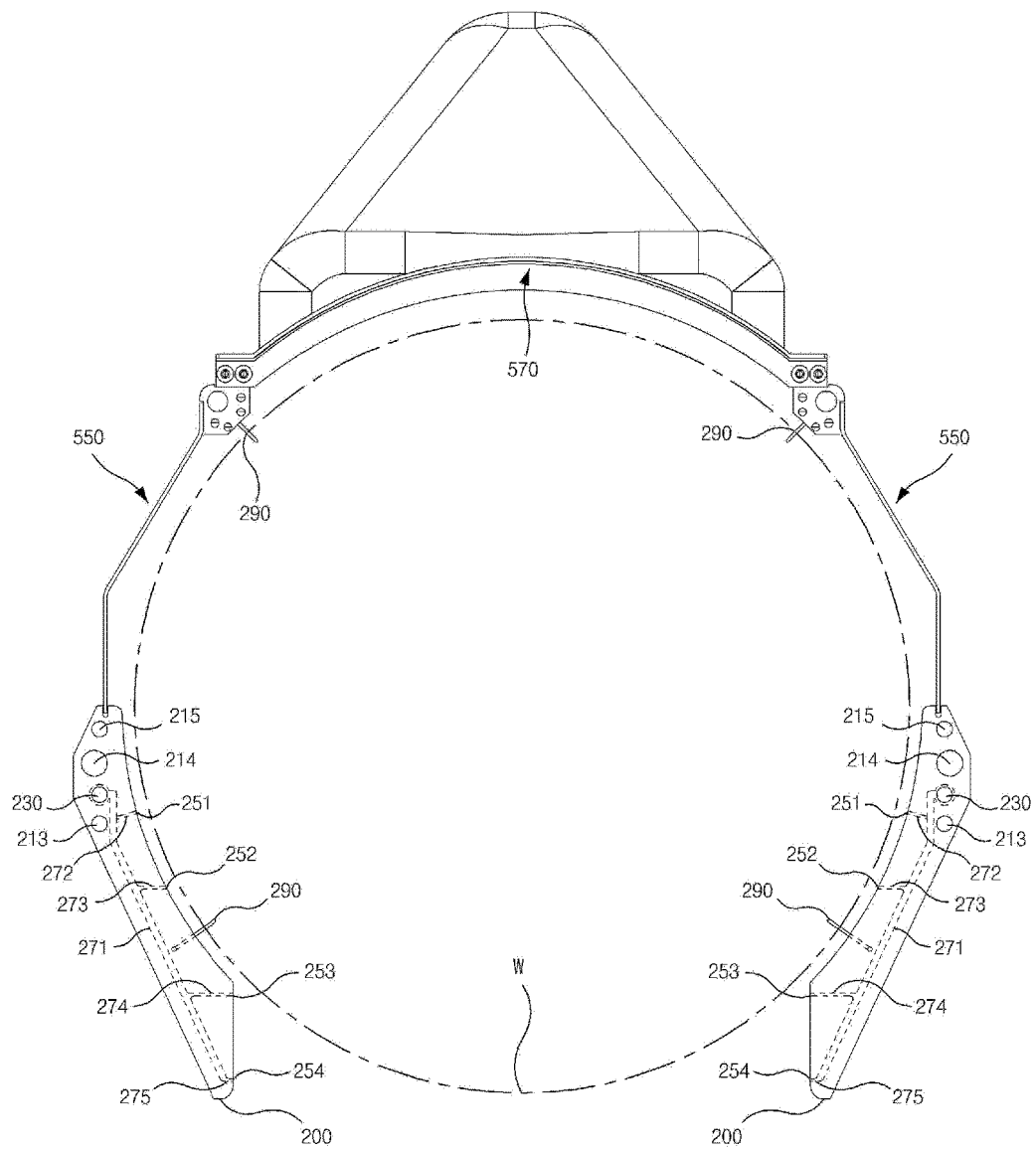
FIGS. 6A and 6B are cross-sectional plan views of FIG. 5 in a top view.
Figure 6B:
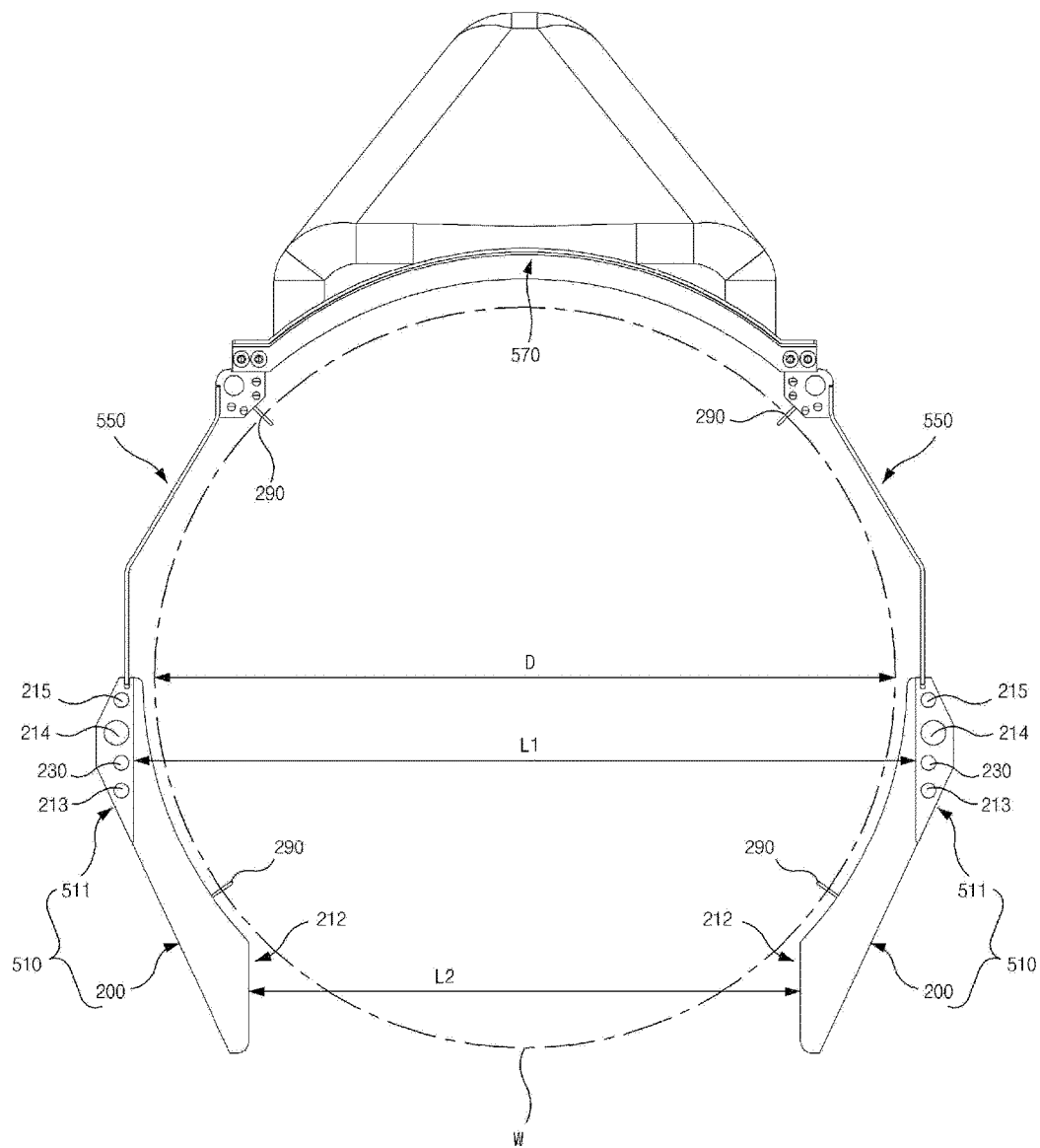
Figure 7:
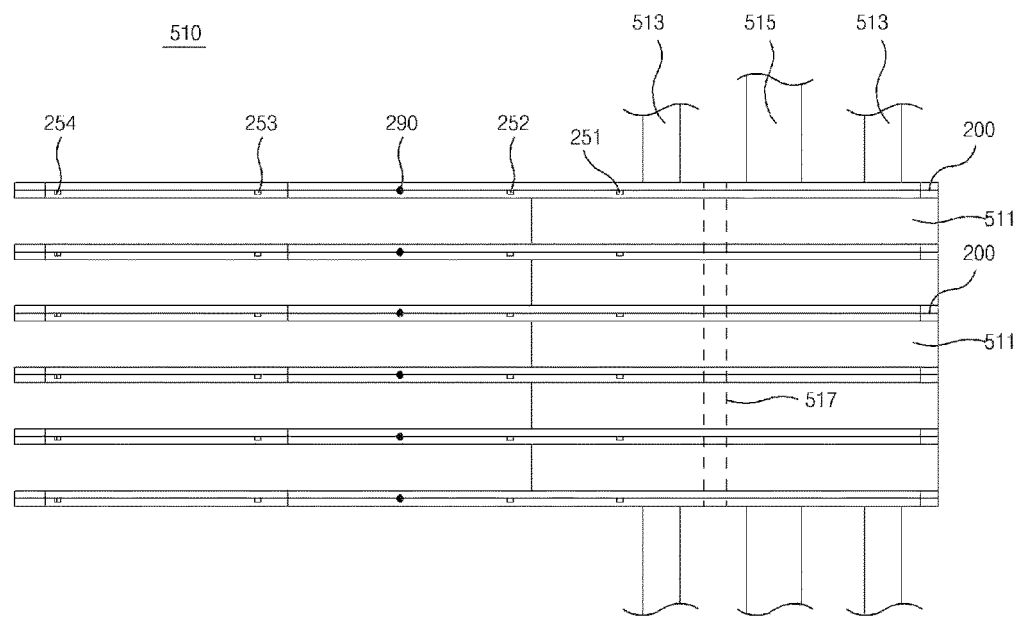
FIG. 7 is an enlarged side view illustrating a first wafer accommodating portion in FIG. 5.
Figure 8:
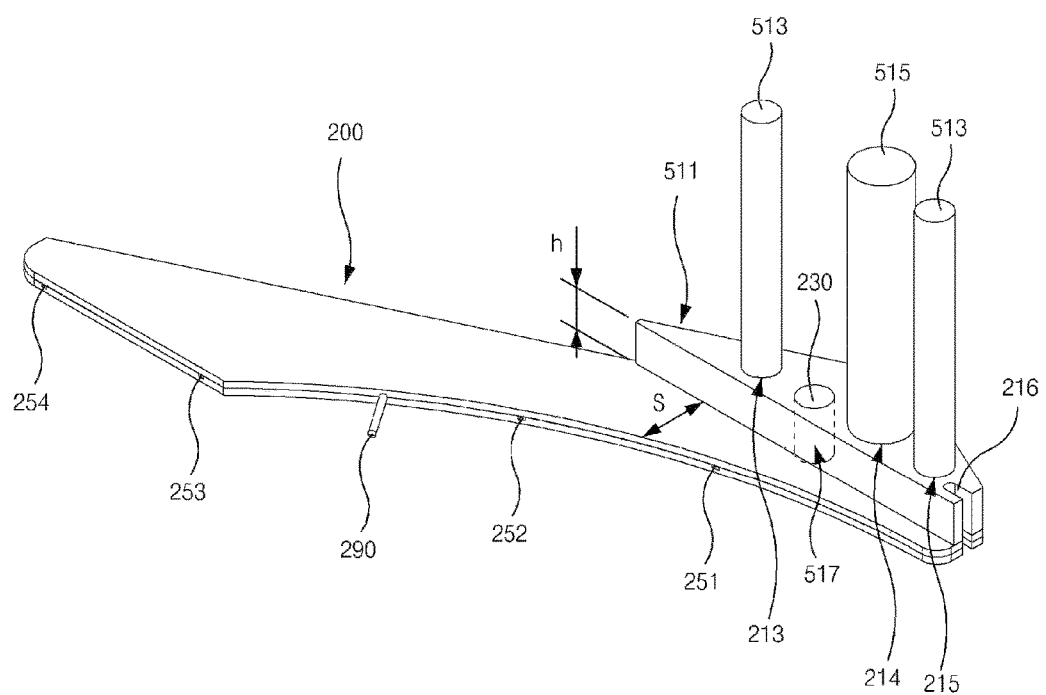
FIG. 8 is a perspective view illustrating a coupling state of a purge gas spraying plate and an intermediate member in FIG. 7.
Figure 9:
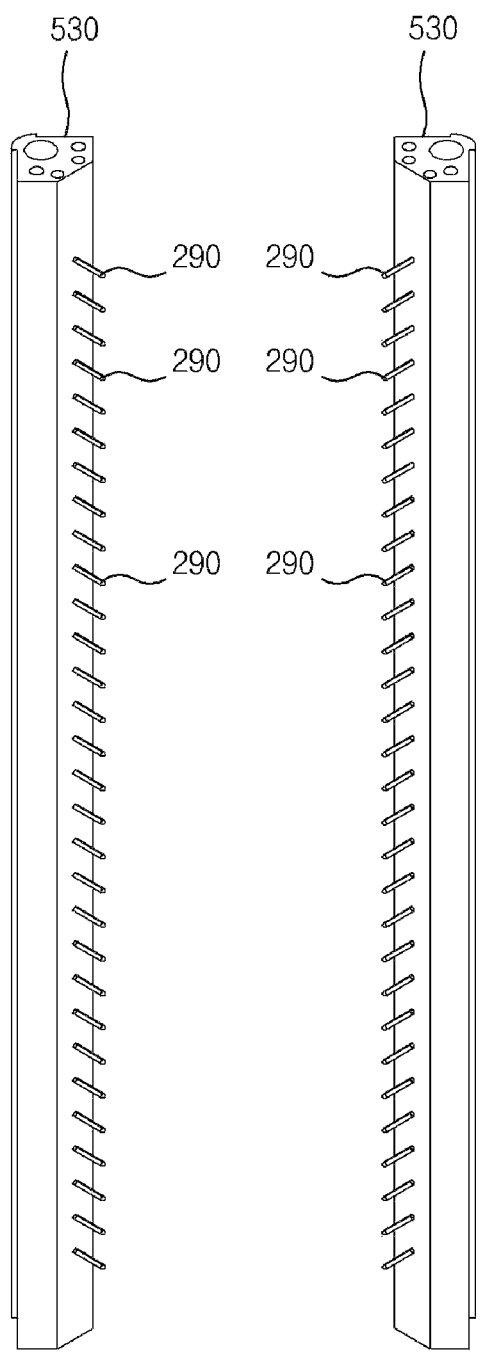
FIG. 9 is an enlarged perspective view illustrating a second wafer accommodating portion in FIG. 5.
Figure 10:
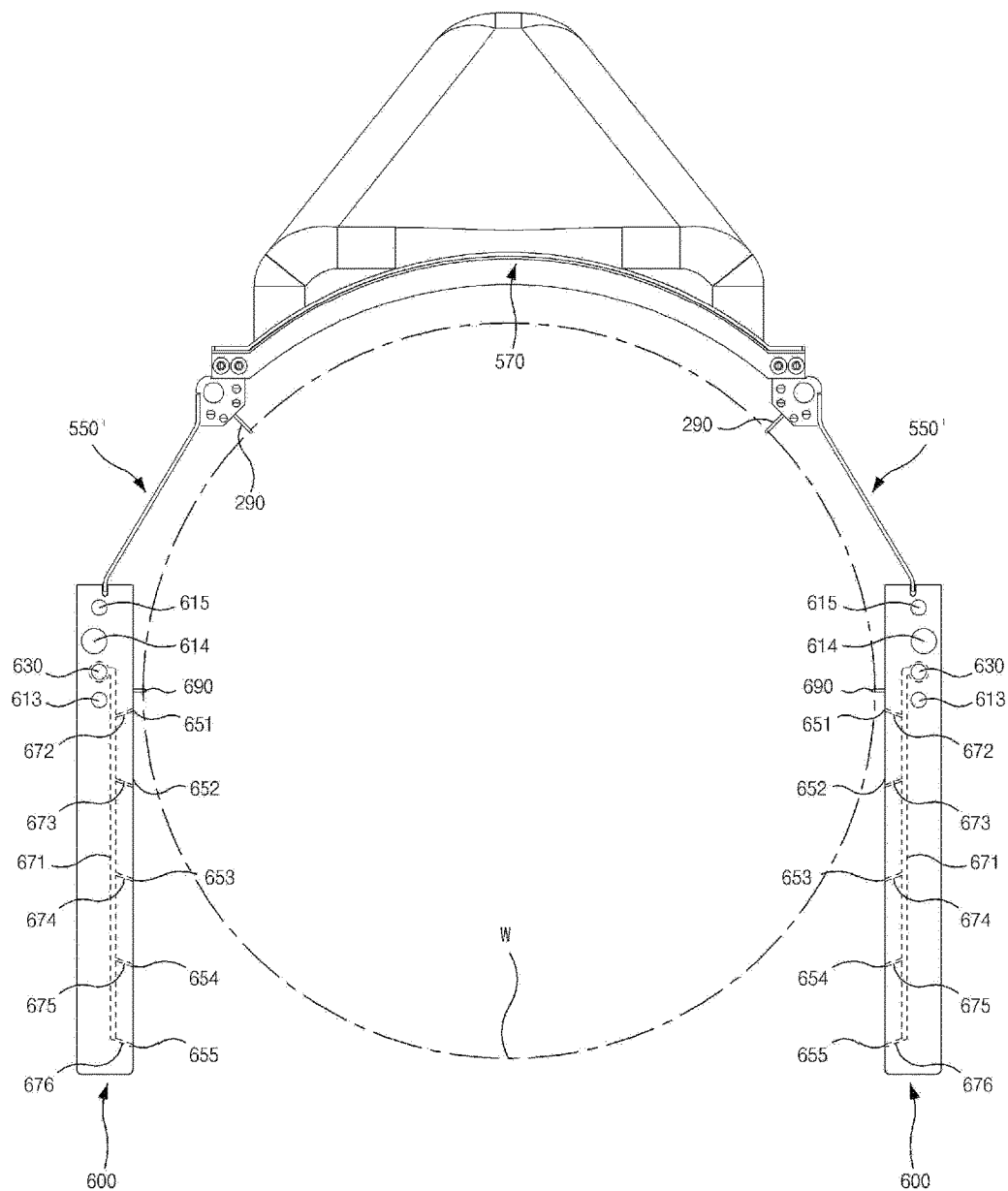
FIG. 10 is a cross-sectional plan view of a wafer cassette in a top view, which includes a purge gas spraying plate according to a second embodiment of the present invention.
Figure 11:
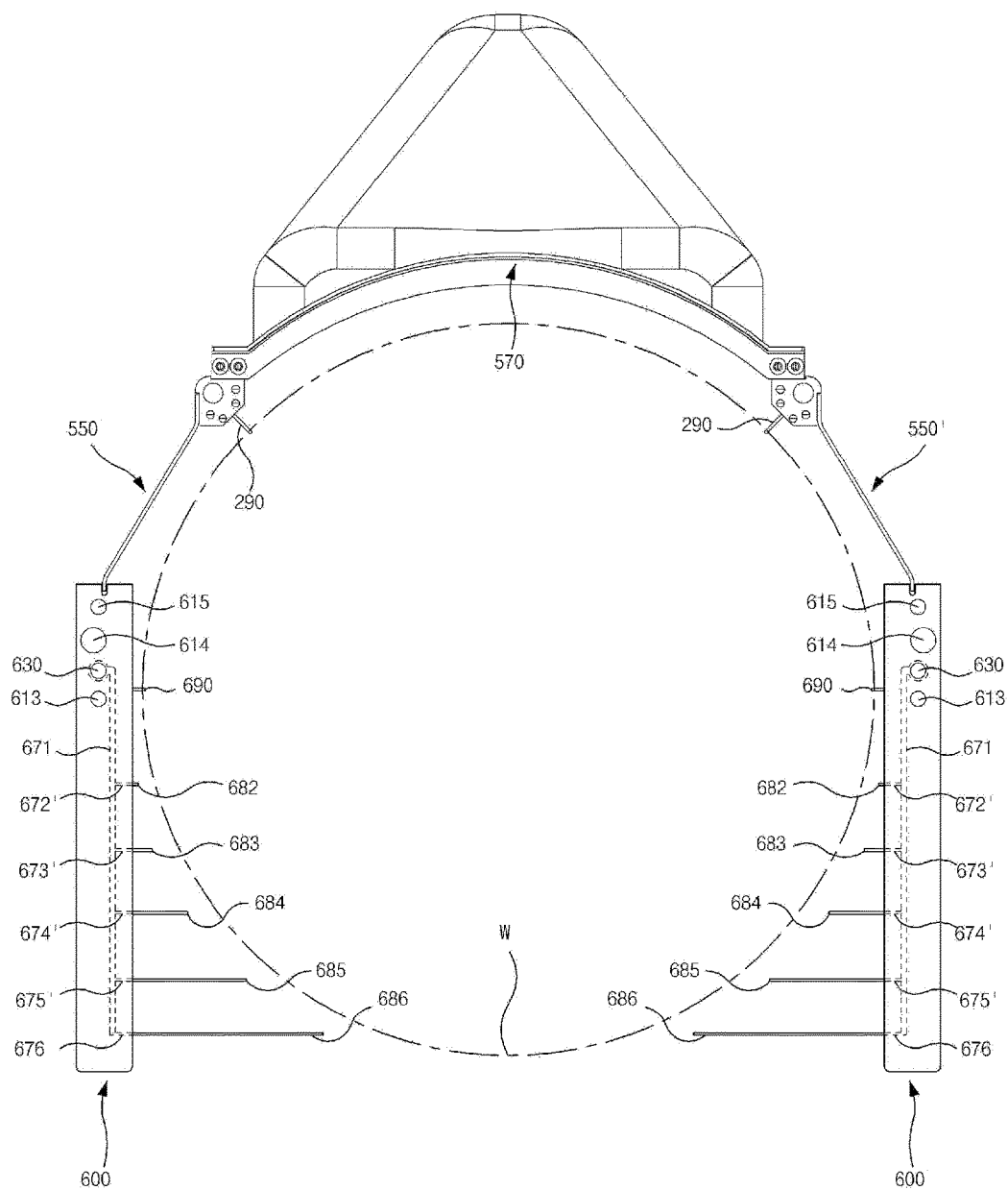
FIG. 11 is a cross-sectional plan view of a wafer cassette in a top view, which includes a purge gas spraying plate according to a third embodiment of the present invention.

FIG. 3 is a perspective view illustrating a purge gas spraying plate according to a first embodiment of the present invention, FIG. 4 is a perspective view illustrating a fume removing apparatus including the purge gas spraying plate according to the first embodiment of the present invention, FIG. 5 is a perspective view illustrating a wafer cassette in FIG. 4, FIGS. 6A and 6B are cross-sectional plan views of FIG. 5 in a top view, FIG. 7 is an enlarged side view illustrating a first wafer accommodating portion in FIG. 5, FIG. 8 is a perspective view illustrating a coupling state of a purge gas spraying plate and an intermediate member in FIG. 7, FIG. 9 is an enlarged perspective view illustrating a second wafer accommodating portion in FIG. 5, FIG. 10 is a cross-sectional plan view of a wafer cassette in a top view, which includes a purge gas spraying plate according to a second embodiment of the present invention, and FIG. 11 is a cross-sectional plan view of a wafer cassette in a top view, which includes a purge gas spraying plate according to a third embodiment of the present invention.

As illustrated in FIG. 3, a purge gas spraying plate 200 according to the first embodiment of the present invention is configured to include a plate 210, an inlet 230 formed in the plate 210, and a flow path 270 in communication with the inlet 230.

The plate 210 may be formed by vertically coupling a first plate 210*a* and a second plate 210*b*.

The first plate 210*a* includes a concave portion 211 formed in a circular arc shape at one side facing a wafer, and a front portion 212 continuously formed from a front end portion of the concave portion 211 and having a width decreasing toward a front of the first plate 210*a*.

The other side of the first plate 210*a* includes a first inclined surface 218 having a slope around the inlet 230 in a direction of the concave portion 211 while linearly continuing from an front end portion of the front portion 212 to a rear end of the first plate 210*a*, and a second inclined surface 219 continuing from the first inclined surface 218, having a slope around a second through hole 214 in the direction of the concave portion 211, and continuing to a coupling groove 216.

At the rear end of the first plate 210*a*, the inlet 230, first to third through holes 213 to 215 are formed to pass through a top surface and a bottom surface of the first plate 210*a*, and the coupling groove 216 is formed in a rear end portion of the first plate 210*a*.

The curvature of the concave portion 211 having the circular arc shape is the same as a curvature of the wafer, and a support rod insertion hole 217 is formed in the concave portion 211, and a support rod 290 which supports the wafer is provided by being inserted into the support rod insertion hole 217.

Thus, since the wafer having the same curvature as the circular arc shape of the concave portion 211 is seated on the support rod 290, the wafer is supported at a close location along the curvature of the concave portion 211, and since a contact area of the support rod 290 with the wafer is minimized, the damage to the wafer may be prevented.

In addition, the wafer may be seated on and supported by an upper surface of the concave portion 211 having the circular arc shape, and in this case, there is an advantage in which the wafer may be supported without installing an additional member such as the support rod 290.

As well as the concave portion 211 being formed in the circular arc shape, the concave portion 211 may be formed in a "<" shape.

Since the width of the front portion 212 decreases toward the front of the plate 210, when a robot arm (not shown) seats the wafer on the support rod 290, the front portion 212 prevents the robot arm from being interfered with by the plate 210.

The first to third through holes 213 to 215 are also formed at an intermediate member 511 to be described below, coupling rods 513 are respectively inserted into the first through hole 213 and the third through hole 215, and a heater rod 515 is inserted into the second through hole 214.

The coupling groove 216 is also formed at the intermediate member 511 to be described below, a panel 550 is inserted into and coupled to the coupling groove 216.

A plurality of bolt holes 225 are formed in the first plate 210a and the second plate 210b, and the first plate 210a and the second plate 210b may be coupled to each other by inserting bolts (not shown) into the bolt holes 225.

In addition, the first plate 210a and the second plate 210b are coupled to each other using the bolts, and it is preferable that an insulating film (not shown) be adhered on an upper surface of the bolts.

To easily perform a fluoro-based resin coating to be described below, the insulating film may cover a bolted coupling portion.

The first plate 210a and the second plate 210b are coupled using the bolts as coupling members, however, they may be also coupled using a welding method or an adhesive.

The second plate 210b includes a concave portion 211 and a front portion 212 atone side thereof, and first and second inclined surfaces 218 and 219 are formed at the other side thereof as the first plate 210a described above.

In addition, an inlet 230, first to third through holes 213 to 215, a coupling groove 216, and a plurality of bolt holes 225 are formed in the second plate 210b at the same positions as in the first plate 210a, and the description thereof will be omitted because it is the same as the first plate 210a described above.

The inlet 230 is formed by passing through the top surfaces and the bottom surfaces at rear ends of the first plate 210a and the second plate 210b as the first to third through holes 213 to 215 described above.

The inlet 230 enables a purge gas supplied from a purge gas supplier of a main body 400 to be described below to flow into the flow path 270, and forms an inflow path 517 by communicating with an inlet 230 formed in the intermediate member 511, and this will be described below in detail.

The flow path 270 is formed in the top surface of the first plate 210a, and the second plate 210b does not have a flow path.

Unlike the first embodiment of the present invention, the flow path 270 may also be formed in a bottom surface of the second plate 210b, and may be formed in the top surface of the first plate 210a or in the bottom surface of the second plate 210b.

The flow path 270 includes a main flow path 271, first to fourth branch flow paths 272 to 275 branched from the main flow path 271, and spraying holes respectively communicating with the first to fourth branch flow paths 272 to 275 and configured to exhaust a purge gas to an outside thereof.

The main flow path 271 enables a gas introduced from the inlet 230 to flow to the first to fourth branch flow paths 272 to 275.

Thus, the purge gas is supplied from a bottom side of the plate 210 and flows through the main flow path 271 from the rear to the front.

The spraying holes includes a first spraying hole 251 and a second spraying hole 252 formed in the concave portion 211 of the first plate 210a, and a third spraying hole 253 and a fourth spraying hole 254 formed at the front portion 212 thereof.

Thus, one ends of the first branch flow path 272 and the second branch flow path 273 communicate with the main flow path 271, and the other ends thereof respectively communicate with the first spraying hole 251 and the second spraying hole 252 formed at the concave portion 211.

In addition, one ends of the third branch flow path 274 and the fourth branch flow path 275 communicate with the main flow path 271, and the other ends thereof respectively communicate with the third spraying hole 253 and the fourth spraying hole 254 formed at the front portion 212.

That is, the first branch flow path 272, the second branch flow path 273, the third branch flow path 274, and the fourth branch flow path 275 each communicate with the main flow path 271 sequentially from the rear end to the front end of the first plate 210a.

In this case, the first to fourth branch flow paths 272 to 275 may be formed to be inclined downward to have a slope so that a purge gas sprayed from the first to fourth spraying holes 251 to 254 is sprayed in a direction of a downward slope.

A cross-sectional area of the main flow path 271 is greater than that of each of the first to fourth branch flow paths 272 to 275. Thus, a purge gas may easily flow from the main flow path 271 in the first to fourth branch flow paths 272 to 275 directions to be respectively discharged to the first to fourth spraying holes 251 to 254 due to the cross-sectional areas differences between the main flow path 271 and each of the first to fourth branch flow paths 272 to 275.

In addition, the cross-sectional areas of the first branch flow path 272 and the first spraying hole 251 most adjacent to the inlet 230 may be smaller than those of the fourth branch flow path 275 and the fourth spraying hole 254, and thus, it is possible to enable an amount of purge gas discharged from the fourth spraying hole 254 to be increased and to enable an amount of purge gas discharged from the first spraying hole 251 to be decreased.

As illustrated in FIGS. 6A and 6B, when a purge gas is sprayed to a wafer W to remove fumes remaining on the wafer W, the above difference in cross-sectional areas causes an amount of purge gas sprayed at a front end of a wafer cassette 500 to be increased and an amount of purge gas sprayed from a rear end thereof to be decreased to help the purge gas discharged flow easily to an exhaust 570.

In addition, in the case of the purge gas discharged from the first spraying hole 251 close to the exhaust 570, since the purge gas is exhausted through the exhaust 570 just after being sprayed, time to remove fumes of the wafer W is comparatively shorter than that of the purge gas discharged from the fourth spraying hole 254.

Thus, the amount of purge gas sprayed from the first spraying hole 251 is decreased and the amount of purge gas sprayed from the fourth spraying hole 254 farthest away from the exhaust 570 is increased to effectively remove fumes remaining on the wafer and reduce the amount of purge gas used.

The first branch flow path 272 close to the inlet 230 and the main flow path 271 form an acute angle based on a direction in which the purge gas flows therein, and the second to fourth branch flow paths 273 to 275 comparatively far from the inlet 230 and the main flow path 271 form an obtuse angle based on a direction in which the purge gas flows therein.

When the main flow path 271 and the branch flow paths form an acute or right angle, since the branch flow paths are formed in a direction opposite a direction in which a purge gas flows, a smaller amount of purge gas is sprayed.

When the main flow path 271 and the branch flow paths form an obtuse angle, since the branch flow paths are formed in a direction in which a purge gas flows, a larger amount of purge gas is sprayed.

Thus, since an amount of purge gas sprayed from the first branch flow path 272 formed in an acute angle to the main flow path 271 is smaller than that of the second to fourth branch flow paths 273 to 275 formed in obtuse angles to the main flow path 271, even when the purge gas supplier of the main body 400 supplies a purge gas using a low pressure, the purge gas may easily flow to the fourth branch flow path 275 farthest away from the inlet 230.

Even when four branch flow paths, that is, the first to fourth branch flow paths 272 to 275, are described as an example, the number thereof can be unlimited without departing the spirit and the scope of the present invention.

It is preferable that the first plate 210a and the second plate 210b be a metal.

This is because a metal has a stronger flexural strength than a plastic and the like to be able to stably support a wafer when the first and second plates 210a and 210b are formed in a cantilever shape, and the metal also has a higher thermal conductivity than the plastic and the like to better able to heat an inside of the wafer cassette 500 when a heater rod 515 to be described below is inserted.

Particularly, aluminum is preferable among the metals described above, and this is because aluminum causes the manufacturing of the flow path 270 to become easy.

In addition, the chemical resistance and the thermal resistance of the purge gas spraying plate 200 may be increased by forming an anodic oxide film on the metal or an anodized layer by anodizing the aluminum.

In addition, since the entire purge gas spraying plate 200 is coated with a fluoro-based resin so as to cover a coupling portion of the contact surfaces of the first plate 210a and the second plate 210b, a purge gas may be prevented from being leaked through the coupling portion of the flow path 270.

Hereinafter, a fume removing apparatus 300 which includes the purge gas spraying plate 200 described above according to the first embodiment of the present invention will be described.

As illustrated in FIGS. 4 to 9, a fume removing apparatus 300 includes the main body 400 and the wafer cassette 500 having purge gas spraying plates 200.

The main body 400 includes a purge gas supplier configured to supply a gas into an inside of the wafer cassette 500, a purge gas discharger configured to discharge the discharged purge gas and fumes, and a controller configured to control the supply and discharge of the purge gas.

The wafer cassette 500 includes first wafer accommodating portions 510 configured to support wafers at the front end thereof, second wafer accommodating portions 530 configured to support the wafers at the rear end thereof, panels 550 configured to connect the first wafer accommodating portions 510 and the second wafer accommodating portions 530, and an exhaust 570 configured to exhaust a purge gas and fumes to the main body 400.

The first wafer accommodating portions 510 include the plurality of purge gas spraying plates 200, intermediate members 511 interposed between the plurality of purge gas spraying plates 200, coupling rods 513 configured to couple the purge gas spraying plates 200 and the intermediate members 511, heater rods 515 configured to heat the first wafer accommodating portions 510, and inflow paths 517 in which a purge gas flows, and are formed at left and right sides at the front end of the wafer cassette 500.

In this case, it is preferable that the number of the plurality of purge gas spraying plates 200 be in a range of twenty to thirty to form the first wafer accommodating portion 510 according to the number of wafers processed by the fume removing apparatus 300.

In addition, since the purge gas spraying plate 200 according to the first embodiment of the present invention has the structure and the effect described above, a duplicated description is omitted.

The inlet 230 and the first to third through holes 213 to 215 are formed in the intermediate member 511 by passing through the top surface and the bottom surface of the intermediate member 511 based on the purge gas spraying plates 200, and a coupling groove 216 is formed in a rear end portion of the intermediate member 511.

The length of the intermediate member 511 is shorter than that of the purge gas spraying plate 200, and the intermediate members 511 are interposed between the plurality of purge gas spraying plates 200.

One side surface of the intermediate member 511 is formed linearly, and the other side surface thereof is formed with a first inclined surface and a second inclined surface (not shown) the same as the other side of the plate 210 of the purge gas spraying plate 200 described above.

Thus, when the intermediate members 511 are coupled between the plurality of purge gas spraying plates 200, the other side surfaces of the intermediate members 511 and the purge gas spraying plates 200 are formed in the same surface shape, however, the one side surfaces of the intermediate members 511 are formed linearly and end portions of the one side surfaces thereof reach the other side surfaces of the purge gas spraying plates 200.

Thus, the concave portion 211 of the purge gas spraying plate 200 and the one side surface of the intermediate member 511 have an interval S therebetween as illustrated in FIG. 8.

In addition, the interval S is increased toward a front end of the purge gas spraying plate 200 due to the concave portion 211 having the circular arc shape. Thus, the interference between the intermediate member 511 and a wafer W may be prevented due to the interval S when the wafer is inserted into the inside of the wafer cassette 500.

The intermediate members 511 have a certain height h, clearance portions in which the purge gas spraying plates 200 stacked as a plurality are spaced apart from each other are formed due to the height h, and wafers may be easily loaded into or unloaded from the inside of the wafer cassette 500 through the clearance portions.

In addition, since a spacing structure having the clearance portions has a heat sink shape, the thermal conductivity thereof is high when the first wafer accommodating portion 510 formed of a metal is heated by the heater rod 515 to be described below, and the spacing structure helps the temperature of the inside of the fume removing apparatus to be easily controlled by being easily cooled after heating the first wafer accommodating portion 510 is completed.

The coupling rods 513 are respectively inserted into the first and the third through holes 213 and 215 respectively formed in the purge gas spraying plate 200 and the intermediate member 511, and nuts are installed at both end portions of the coupling rods 513, to couple the plurality of purge gas spraying plates 200 and the intermediate members 511 together.

The heater rod 515 is inserted into the second through holes 214 respectively formed in the purge gas spraying plate 200 and the intermediate member 511 and heats the first wafer accommodating portion 510 to remove the humidity of the inside of the wafer cassette 500.

In addition, the heater rod 515 directly heats the first wafer accommodating portion 510 in a conductive manner, and a purge gas which flows at an inside of the purge gas spraying plate 200 is heated. Thus, the heater rod 515 helps the purge gas flow more actively in the flow path 270 and the like, and the purge gas be easily sprayed.

The inflow path 517 is formed in a stack structure of inlets 230 formed in the intermediate member 511 and the purge gas spraying plate 200 as described above.

That is, the inlet 230 of the intermediate member 511 communicates with the inlet 230 formed in the purge gas spraying plate 200, and the plurality of inlets 230 form the inflow path 517 due to the stack structure of the plurality of intermediate members 511 and the purge gas spraying plates 200.

The inflow path 517 supplies a purge gas supplied from the purge gas supplier of the main body 400 to paths 270 of the plurality of purge gas spraying plates 200.

In addition, since the inflow path 517 is formed with the plurality of inlets 230, a purge gas may be leaked through coupling portions between the inlets 230, and in order to prevent this, it is preferable that the entire first wafer accommodating portion 510 formed by coupling the plurality of purge gas spraying plates 200 and the intermediate members 511 be coated with a fluoro-based resin.

The second wafer accommodating portions 530 are formed on left and right sides at the rear end of the wafer cassette 500.

In the second wafer accommodating portion 530, a plurality of support rods 290 are formed to support wafers inserted into the wafer cassette 500.

One end of the panel 550 is inserted into and coupled to coupling grooves 216 formed in the plurality of purge gas spraying plates 200 which configure the first wafer accommodating portion 510, and the other end thereof is coupled to the second wafer accommodating portion 530. Thus, the panels 550 are formed at the left and right of the center of the wafer cassette 500, that is, between the first wafer accommodating portion 510 and the second wafer accommodating portion 530.

The panel 550 prevents a purge gas and fumes in the inside of the wafer cassette 500 from being discharged to an outside thereof.

In addition, it is preferable that the panel 550 be formed of a transparent material such as an acryl or the like, and due to this, users may visually recognize that fumes remaining on wafers loaded inside the fume removing apparatus 300 are removed.

The panel 550 is formed in the "<" shape, bent toward the outside of the wafer cassette 500.

Also, the shape of the panel 550 may be, as illustrated in FIGS. 10 and 11, different according to purge gas spraying plates 600 and 600' of second and third embodiments of the present invention to be described below, that is, shapes of purge gas spraying plates.

That is, in the case of a panel 550' illustrated in FIGS. 10 and 11, since a coupling groove of the purge gas spraying plates 600 and 600' according to the second and third embodiments of the present invention is disposed more rearward than the coupling groove 216 of the purge gas spraying plate 200 according to the first embodiment of the present invention, the panel 550' is formed in a linear shape rather than the "<" shape.

The exhaust 570 includes one side formed in a circular arc shape having the same curvature as a wafer W, and a plurality of holes are provided in the one side of the circular arc shape and disposed at the rear end of the wafer cassette 500, and the exhaust 570 exhausts a purge gas and fumes remaining inside the wafer cassette 500 to the purge gas discharger of the main body 400.

That is, as illustrated in FIGS. 6A and 6B, since the exhaust 570 in addition to the first wafer accommodating portion 510 described above have the one sides in which a purge gas flows are formed in the circular arc shape, the left and right first wafer accommodating portions 510 surround left and right sides of the front end of the wafer W, the exhaust 570 surrounds the rear end surfaces of the wafer W, and the panels 550 also surround a left and right sides of the rear end of the wafer W, a compact structure is formed.

Hereinafter, a process in which a robot arm transfers a wafer to the wafer cassette 500 and fumes remaining on the wafer are removed by spraying a purge gas are described according to the configuration described above.

As illustrated in FIG. 6B, one sides of left and right intermediate members 511 are perpendicularly formed to a center line (the line shown as the diameter D in FIG. 6B) of the wafer W, and have a distance (hereinafter, referred to as L1) from each other.

The front portions 212 of the purge gas spraying plates 200 of the left and right first wafer accommodating portions 510 each are perpendicularly formed to the center line of the wafer W, and have a distance (hereinafter, referred to as L2) from each other.

The length of the L1 is longer than that of the diameter D of the wafer W, the length of the L2 is shorter than that of the diameter D of the wafer W. That is, the lengths of the L1, L2, and D have a relation 'L1>D>L2'.

A robot arm loads the wafer W, and moves into the cassette 500 through a space, that is, the clearance portion formed between the plurality of stacked purge gas spraying plates 200, formed due to the height h of the intermediate member 511 described above, so that the robot arm inserts the wafer W thereinto.

In this case, since the distance L1 between the left and right sides intermediate members 511 is longer than the diameter D of the wafer, the wafer W may be easily inserted into the wafer cassette 500 without being interfered with by the intermediate member 511.

The robot arm moves into the wafer cassette 500 unloads the wafer W to be supported by the support rods 290 formed in the first wafer accommodating portions 510 and the second wafer accommodating portions 530, and moves out of the wafer cassette 500.

In this case, because of the distance L2 between the front portions 212 of the left and right purge gas spraying plates 200, the robot arm easily moves out of the wafer cassette 500 without being interfered with by the purge gas spraying plates 200.

The wafer W transferred by the robot arm is supported by the support rods 290 of the purge gas spraying plates 200 of the first wafer accommodating portions 510 at the left and right front end of the wafer cassette 500 and the support rods 290 of the second wafer accommodating portions 530 of the left and right rear end of the wafer cassette 500.

Thus, since the wafer W is supported by four support rods, the contact area thereof is minimized and the damage to the wafer W may be prevented.

In addition, so that a purge gas is sprayed easily, the wafer W and the concave portion 211 facing the wafer W have a spacing gap therebetween along the circular arc shape of the wafer W.

When all of the wafers W are completely transferred into the wafer cassette 500, the purge gas controller installed at the main body 400 supplies a purge gas through the purge gas supplier.

The supplied purge gas flows through the inlet 230 to the flow path 270 of the purge gas spraying plate 200, the flowing purge gas is sprayed to the inside of the wafer cassette 500 through the first to fourth spraying holes 251 to 254.

The first and second spraying holes 251 and 252 formed on the concave portion 211 of the purge gas spraying plate 200 spray the purge gas toward the wafer W, and the third and fourth spraying holes 253 and 254 formed in the front portion 212 spray a purge gas to the front end of the wafer W.

Particularly, in the case of a purge gas sprayed from the fourth spraying hole 254, since the purge gas is sprayed toward an entrance through which the wafer W enters, the purge gas may serve as an air curtain which prevents a harmful gas existing at an outside thereof from entering the fume removing apparatus 300 during the wafer process.

The purge gas sprayed as described above flows with fumes remaining on a surface of the wafer toward the exhaust 570 at the rear end of the wafer cassette 500, and is discharged to the purge gas discharger of the main body 400 through a plurality of holes provided in the exhaust 570.

That is, the purge gases discharged from the front end of the wafer cassette 500 flow toward the rear end thereof due to the exhaust 570 on the rear end thereof.

The flow of the purge gas described above is performed for each of the wafers in the wafer cassette 500.

In addition, as illustrated in FIG. 8, since the first to fourth spraying holes 251 to 254 of the purge gas spraying plate 200 described above are formed at a lower level than the support rod 290, the purge gas is actually sprayed to a bottom surface of the wafer supported by the purge gas spraying plate 200.

In this case, generally, since a surface of a wafer required to be cleaned is an upper surface rather than the bottom surface, each purge gas spraying plate 200 cleans a wafer supported by the purge gas spraying plate 200 just below itself rather than a wafer supported by itself.

In addition, as described above, the first to fourth branch flow paths 272 to 275 of the purge gas spraying plate 200 may be formed to be inclined downward, and thus, the first to fourth spraying holes 251 to 254 respectively communicating with the first to fourth branch flow paths 272 to 275 may be formed to be inclined downward.

In this case, since a purge gas sprayed from the first to fourth spraying holes 251 to 254 respectively communicating with the first to fourth branch flow paths 272 to 275 inclined downward is sprayed from a top to a bottom with a certain pressure, fumes remaining on the wafer may be more effectively removed.

In addition, even when a wafer W supported by a purge gas spraying plate 200 just below each purge gas spraying plate 200 is not presented, a purge gas may be sprayed further downward to be able to remove fumes remaining on a wafer supported by a purge gas spraying plate 200 under the purge gas spraying plate 200 having no wafer since the first to fourth spraying holes 251 to 254 respectively communicating with the first to fourth branch flow paths 272 to 275 are formed to be inclined downward.

Hereinafter, the second embodiment and the third embodiment of the purge gas spraying plate described above will be described.

The purge gas spraying plate 600 according to the second embodiment of the present invention may have an appearance formed in a rectangular shape as illustrated in FIG. 10.

The purge gas spraying plate 600 includes a plate formed by coupling a first plate and a second plate, an inlet 630, and a flow path, the same as in the purge gas spraying plate 200 according to the first embodiment of the present invention.

The plate has the rectangular shape, a support rod 690 inserted into one side of the plate, a flow path and first to third through holes 613 to 615 formed in a rear end of the plate, a coupling groove formed in a rear end portion, and a bolt hole (not shown) formed in a surface thereof.

The description of the functions and effects of the support rod 690, the inlet 630, the first to third through holes 613 to 615, the coupling groove, and the bolt hole will be omitted because it is the same as those of the purge gas spraying plate 200 according to the first embodiment of the present invention.

The flow path includes a main flow path 671, first to fifth branch flow paths 672 to 676 branched from the main flow path 671, and first to fifth spraying holes 651 to 655 respectively communicating with the first to branch flow paths 672 to 676 to discharge a purge gas to an outside thereof.

The first to fifth spraying holes 651 to 655 are formed to respectively communicate with the first to fifth branch flow paths 672 to 676, formed in parallel at one side surface of the plate, and spray a purge gas introduced from the inlet 630 to a wafer W.

The flow path may be formed in at least one of the first plate and the second plate as in the purge gas spraying plate 200 according to the first embodiment of the present invention described above.

In addition, the description of the function and the effect of the flow path will be omitted because it is the same as that of the flow path 270 of the purge gas spraying plate 200 according to the first embodiment of the present invention except the fifth branch flow path 676 and the fifth spraying hole 655 communicating with the fifth branch flow path 676 and configured to spray a purge gas to an outside thereof are further included.

Even when five branch flow paths are described above by exemplifying the first to fifth branch flow paths 672 to 676, the number thereof can be unlimited without departing from the spirit and the scope of the present invention.

As illustrated in FIG. 11, a purge gas spraying plate 600' according to the third embodiment of the present invention may further include first to fifth nozzles 682 to 686.

The first to fifth nozzles 682 to 686 are installed to respectively communicate with first to fifth branch flow paths 672' to 676', and spray a purge gas introduced from an inlet 630 to a wafer W.

In addition, the lengths of the first to fifth nozzles 682 to 686 are formed along a shape of a curvature of the wafer W facing one side of the purge gas spraying plate 600'.

That is, the lengths thereof become longer in order of the first nozzle 682 to the fifth nozzle 686 according to the shape of the wafer W, and thus, a virtual line which connects one end portions of the first to fifth nozzles 682 to 686 which spray a purge gas is formed to have a circular arc shape.

Thus, even when the one side of the purge gas spraying plate 600' does not include a concave portion having a circular arc shape unlike the purge gas spraying plate 200 according to the first embodiment of the present invention, it is possible to achieve the removal of fumes remaining on a surface of the wafer without a dead zone by installing the first to fifth nozzles 682 to 686 having different lengths.

Even when five nozzles are described above by exemplifying the first to fifth nozzles 682 to 686, the number thereof can be unlimited without departing from the spirit and the scope of the present invention.

Hereinafter, a method of manufacturing a purge gas spraying plate according to the first to third embodiments of the present invention will be described.

When a first plate and a second plate forming a plate of a purge gas spraying plate are manufactured, the appearance and the configuration elements of the first plate and the second plate may be manufactured in the same way as purge gas spraying plates 200, 600, and 600' of the first to third embodiments of the present invention.

In addition, it is preferable that the first plate and the second plate have the same shape, but it is not limited thereto.

The flow path may be formed in at least one of the first plate and the second plate.

That is, even when the flow path may be formed in one of the first plate or the second plate, it is not a problem that the flow paths are respectively formed in the first plate and the second plate to form one path by coupling the first plate and the second plate.

It is preferable that the first and second plates be formed of a metal, particularly aluminum, and in this case, an anodic oxide film (in the case of aluminum, an anodizing layer) may be formed.

When the anodic oxide film is formed on a surface of the first and second plate, an anodic oxide film is also formed on the flow path. Thus, even when fumes enter the flow path using the fume removing apparatus for a long time, the corrosion or deformation thereof may be prevented.

It is preferable that the first and second plate, after an anodic oxide film process is completed, be coupled using bolts.

It is preferable that insulating film be adhered at gaps generated due to bolt-coupling after coupling of the first and second plates is finished.

The bolt may be prevented from becoming loose, and the gap may be prevented from not being coated when coating with a fluoro-based resin to be described below by adhering the insulating films.

In addition, the fluoro-based resin coating may be performed easily and aesthetic impression may be also secured by the insulating film blocking the gap.

It is preferable that the insulating film be formed of a polyimide film.

The polyimide film is, unlike a general film, has an excellent insulating property, thermal resistance, and chemical resistance, and thus, the fume removing apparatus is not deformed even when used for a long time.

In addition, it is possible to use the Kapton® film which is generally used by a general engineer as a polyimide-based film.

It is preferable that the purge gas spraying plate in which the insulating film is adhered be coated with a fluoro-based resin.

The fluoro-based resin used for the fluoro-based resin coating has excellent thermal resistance and chemical resistance, and thus, the purge gas spraying plate exposed to fumes is prevented from being corroded or deformed.

In addition, since the fluoro-based resin coating is performed on the coupling surface, that is, the coupling portion, of the first plate and the second plate, a purge gas is prevented from leaking from the flow path in which the coupling portion is formed.

Types of the fluoro-based resin used for the fluoro-based resin coating includes polytetrafluoroethylene (PTFE), polychlorotrifluoroethylene (PCTFE), polyvinylidene fluoride (PVDF), etc.

In addition, it is possible to use a TEFLON® which is generally used by a general engineer as the fluoro-based resin coating.

While the example embodiments of the present invention and their advantages have been described above in detail, it should be understood that various changes, substitutions and alterations may be made thereto without departing from the scope of the invention as defined by the following claims.

What is claimed is:

1. A purge gas spraying plate of a fume removing apparatus of a semiconductor manufacturing apparatus, comprising:
a first plate assembly and a second plate assembly, each of the first plate assembly and the second plate assembly being formed of a first plate and a second plate disposed on the first plate, each of the first plate assembly and the second plate assembly to support a semiconductor manufacturing wafer, wherein the first plate assembly and the second plate assembly are spaced apart from each other to form a space in-between;
the second plate assembly formed near the first plate assembly, an inlet penetrating through the first plates and the second plates of the first plate assembly and the second plate assembly; a flow path formed in each of the first plate assembly and the second plate assembly and communicating with the inlet, wherein the flow path includes a concave flow path formed in at least one of an upper surface of the first plate and a bottom surface of the second plate; and
the semiconductor manufacturing wafer to be loaded into or unloaded from the space in-between.

2. The plate of claim 1, wherein the flow path comprises:
a main flow path through which a purge gas introduced from the inlet flows; and
a branch flow path having one end in communication with the main flow path and the other end configured to spray the purge gas to an outside thereof.

3. The plate of claim 2, wherein the purge gas is sprayed in a direction of a downward slope from the other end of the branch flow path.

4. The plate of claim 2, wherein a cross-sectional area of the main flow path is greater than that of the branch flow path.

5. The plate of claim 2, wherein the branch flow path includes a first branch flow path and a second branch flow path, the second branch flow path being closer to the inlet than the first branch flow path, and wherein a cross-sectional area of the second branch flow path is smaller than that of the first branch flow path.

6. The plate of claim 2, wherein an obtuse angle is formed between the main flow path and the branch flow path based on a direction in which the purge gas flows.

7. The plate of claim 2, wherein the branch flow path includes a plurality of branch flow paths, and a farthermost branch flow path from the inlet and the main flow path form an obtuse angle based on a direction in which the purge gas flows.

8. The plate of claim 2, wherein the branch flow path includes a nozzle installed at and protrudes from the other end of the branch flow path, and the nozzle protrudes more from the first plate assembly or the second plate assembly.

9. The plate of claim 2, wherein the branch flow path includes a first branch flow path and a second branch flow path, the first branch flow path includes a first nozzle installed at and protrudes from the other end of the first branch flow path, the nozzle protrudes more from the first plate assembly or the second plate assembly, and the second branch flow path includes a second nozzle installed at and protrudes from the other end of the second branch flow path, and a length of the first nozzle is longer than that of the second nozzle.

10. The plate of claim 1, wherein the first plate assembly or the second plate assembly are made of a metal, and an anodic oxide film is formed on a surface of the flow path.

11. The plate of claim 10, wherein the first plate assembly or the second plate assembly is made of aluminum, and the anodic oxide film is an anodized layer formed by anodizing the aluminum.

12. The plate of claim 1, further comprising:
a coupling member configured to couple the first plate and the second plate to each other; and
an insulating film adhered on a surface of the coupling member.

13. The plate of claim 12, wherein a fluoro-based resin coating layer is formed on the first plate assembly or the second plate assembly.

14. The plate of claim 1, wherein the first plate assembly or the second plate assembly comprises a support member configured to support the semiconductor manufacturing wafer formed on the first plate assembly or the second plate assembly.

15. The plate of claim 1, wherein the first plate assembly or the second plate assembly includes a concave portion formed at one side facing the semiconductor manufacturing wafer.

16. The plate of claim 15, wherein the concave portion is formed in a circular arc shape.

17. The plate of claim 15, wherein the first plate assembly or the second plate assembly comprises a support member configured to support the wafer formed on the concave portion.

* * * * *